US011258935B2

(12) United States Patent
Park et al.

(10) Patent No.: US 11,258,935 B2
(45) Date of Patent: Feb. 22, 2022

(54) DUAL IMAGE SENSOR INCLUDING QUANTUM DOT LAYER

(71) Applicant: Industry-University Cooperation Foundation Hanyang University, Seoul (KR)

(72) Inventors: Jea Gun Park, Seongnam-si (KR); Il Hwan Kim, Seoul (KR); Jun Seong Park, Anyang-si (KR); Ji Ho Choi, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 708 days.

(21) Appl. No.: 16/080,347

(22) PCT Filed: Apr. 20, 2018

(86) PCT No.: PCT/KR2018/004605
§ 371 (c)(1),
(2) Date: Aug. 28, 2018

(87) PCT Pub. No.: WO2019/194341
PCT Pub. Date: Oct. 10, 2019

(65) Prior Publication Data
US 2021/0195077 A1 Jun. 24, 2021

(30) Foreign Application Priority Data
Apr. 6, 2018 (KR) .................. 10-2018-0040188

(51) Int. Cl.
*H04N 5/225* (2006.01)
*H04N 13/239* (2018.01)
*H04N 9/04* (2006.01)
*C09K 11/08* (2006.01)
*H01L 27/146* (2006.01)
*H01L 31/0232* (2014.01)
*B82Y 20/00* (2011.01)

(52) U.S. Cl.
CPC .......... *H04N 5/2258* (2013.01); *C09K 11/08* (2013.01); *H01L 27/14618* (2013.01); (Continued)

(58) Field of Classification Search
CPC .............. H04N 5/2258; H04N 13/239; H04N 9/04557; C09K 11/08; H01L 27/14618; H01L 27/14621; H01L 27/14627
See application file for complete search history.

(56) References Cited

U.S. PATENT DOCUMENTS 9,635,325 B2 * 4/2017 Borthakur ......... H01L 27/14627
10,088,358 B1 * 10/2018 O'Driscoll ............. G01J 1/429
(Continued)

FOREIGN PATENT DOCUMENTS

JP 2003-92395 A 3/2003
JP 2014-241584 A 12/2014
(Continued)

OTHER PUBLICATIONS

Communication dated Nov. 9, 2018, from Korean Intellectual Property Office in counterpart application No. 10-2018-0040188.
(Continued)

Primary Examiner — Jonathan R Messmore
(74) Attorney, Agent, or Firm — Sughrue Mion, PLLC

(57) ABSTRACT

The present invention discloses a dual image sensor. The dual image sensor according to one embodiment of the present invention includes first and second image sensor modules mounted on a printed circuit board, wherein the first image sensor module includes a first housing mounted on the printed circuit board; a first image sensor mounted on the printed circuit board and formed on a first surface of the first housing; and a first lens formed on a second surface of the first housing, and the second image sensor module includes a second housing mounted on the printed circuit (Continued)

board; a second image sensor mounted on the printed circuit board and formed on a first surface of the second housing; a second lens formed on a second surface of the second housing; and a quantum dot layer formed between the second image sensor and the second lens and absorbing ultraviolet light and emitting visible light converted from the absorbed ultraviolet light.

19 Claims, 9 Drawing Sheets

(52) U.S. Cl.
CPC .. *H01L 27/14621* (2013.01); *H01L 27/14627* (2013.01); *H01L 27/14636* (2013.01); *H01L 27/14645* (2013.01); *H01L 31/02322* (2013.01); *H04N 5/2253* (2013.01); *H04N 5/2256* (2013.01); *H04N 9/04557* (2018.08); *H04N 13/239* (2018.05); *B82Y 20/00* (2013.01)

(56) References Cited

U.S. PATENT DOCUMENTS

2013/0078411 A1* 3/2013 Gaska .................... C09K 11/02 428/68
2016/0288330 A1* 10/2016 Konolige ............. H04N 13/254
2018/0174534 A1* 6/2018 Ninan .................... G02B 6/004
2018/0374975 A1* 12/2018 Ayon ............... H01L 31/02167

FOREIGN PATENT DOCUMENTS

| JP | 2017-146580 A | 8/2017 |
| KR | 10-0853689 B1 | 8/2008 |
| KR | 10-2010-0011676 A | 2/2010 |
| KR | 10-2010-0079088 A | 7/2010 |
| KR | 10-2011-0037204 A | 4/2011 |
| KR | 10-2015-0118885 A | 10/2015 |
| KR | 10-2016-0099995 A | 8/2016 |
| KR | 10-2016-0145518 A | 12/2016 |
| KR | 10-2017-0018625 A | 2/2017 |
| WO | 2018/030043 A1 | 2/2018 |

OTHER PUBLICATIONS

Ludong Li et al., "ZnO Quantum Dot Decorated Zn2SnO4 Nanowire Heterojunction Photodetectors with Drastic Performance Enhancement and Flexible Ultraviolet Image Sensors", ACS Nano, 2017, pp. 4067-4076, vol. 11, No. 4.
Office Action dated Jun. 30, 2020 in Japanese Application No. 2018-545993.
International Search Report dated Mar. 18, 2019 in International Application No. PCT/KR2018/004605.

* cited by examiner

[FIG. 1A]
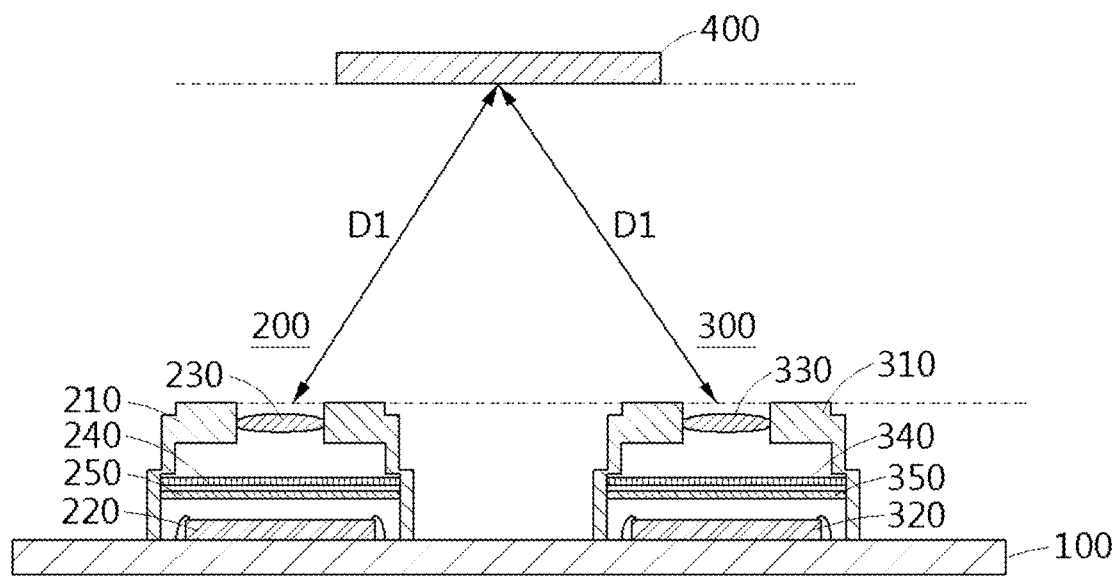
[FIG. 1B]
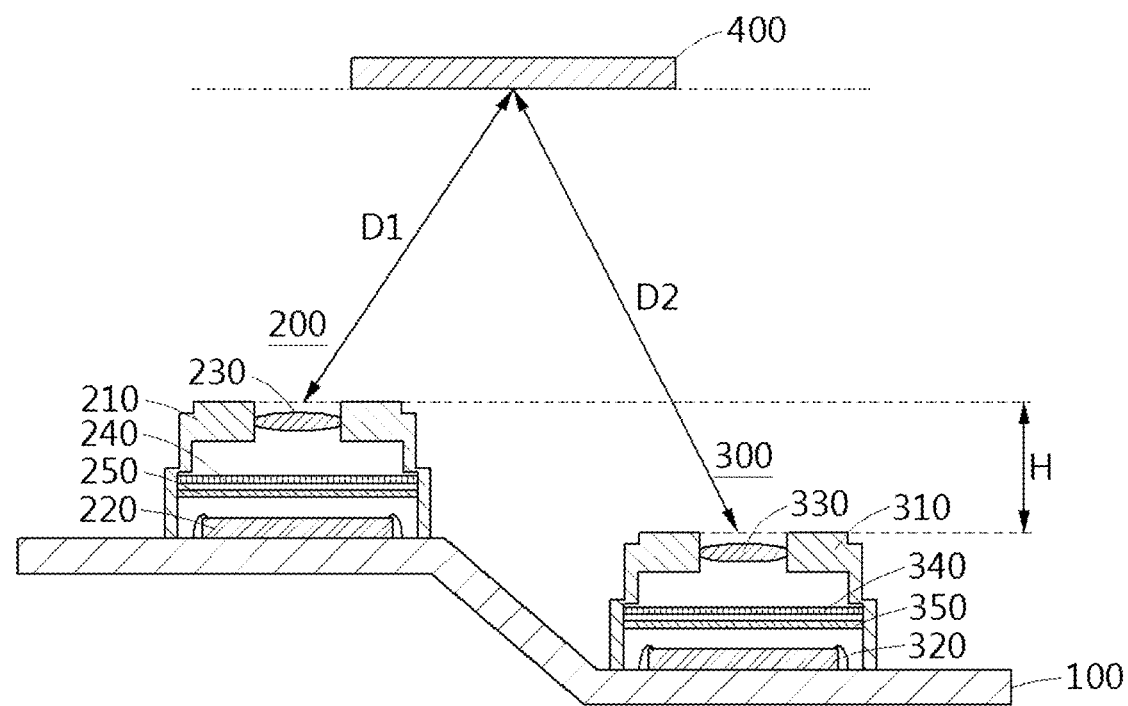

[FIG. 1C]
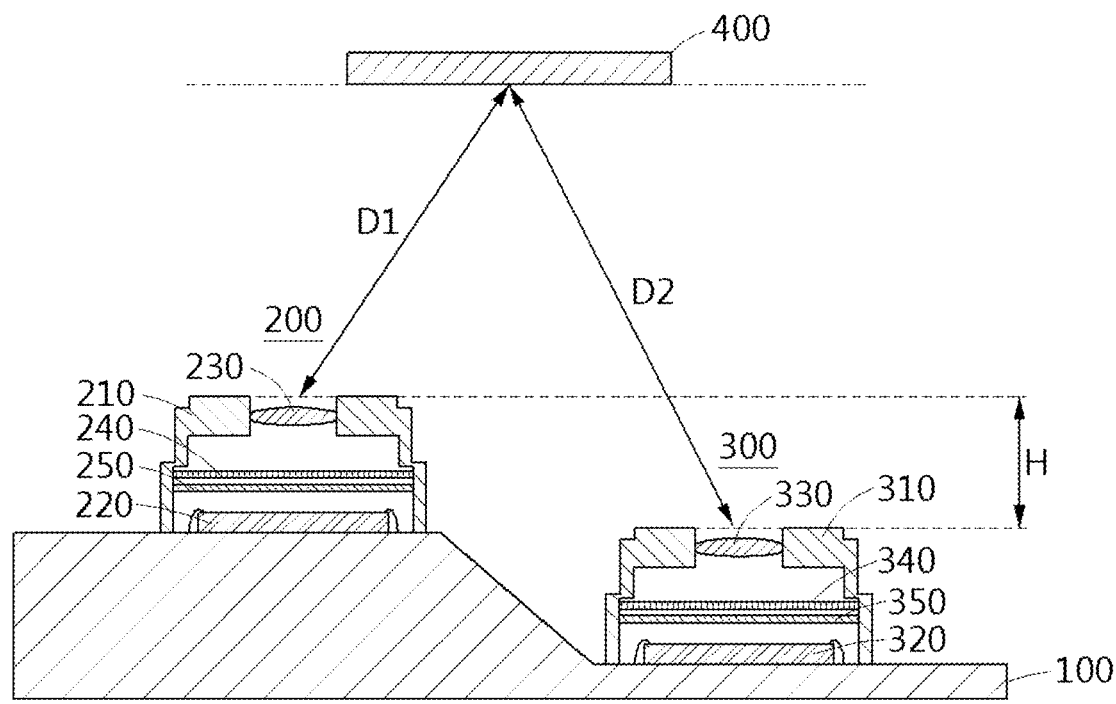
[FIG. 2]
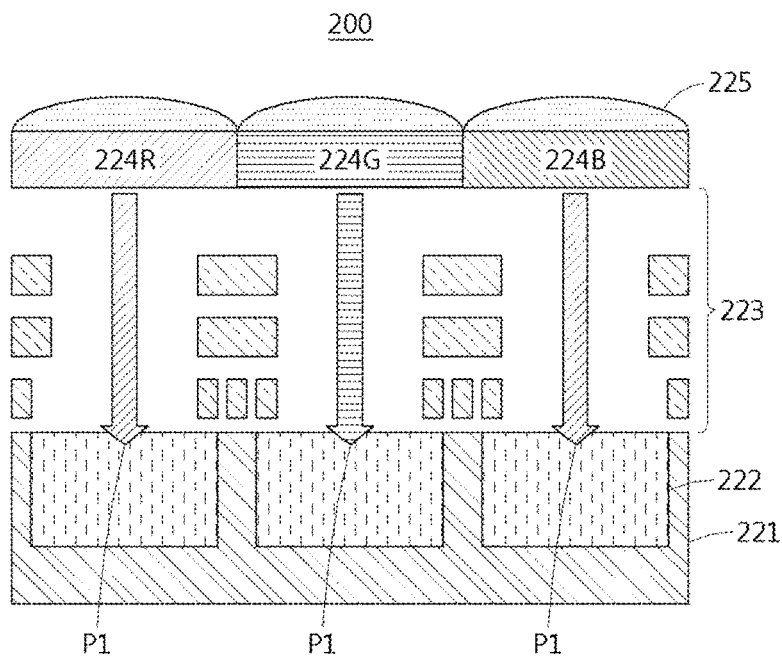

[FIG. 3]
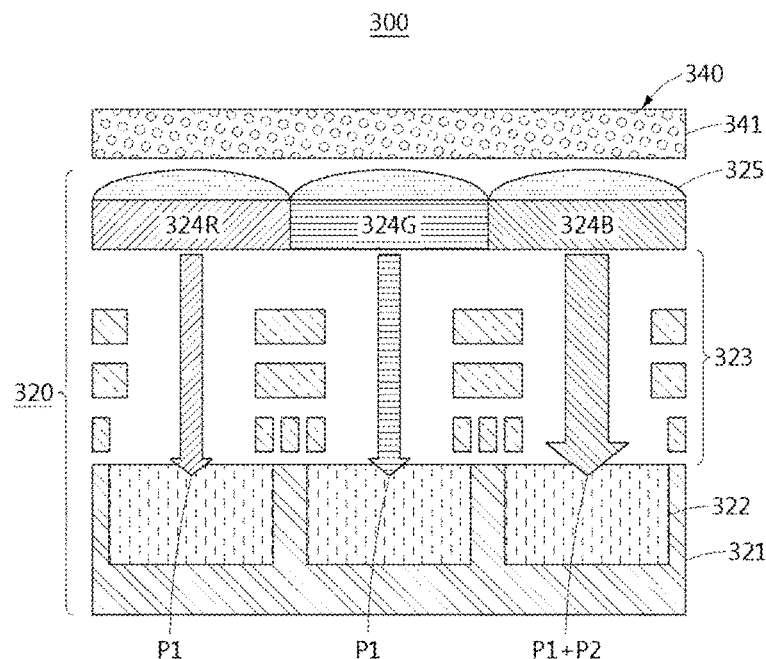
[FIG. 4]
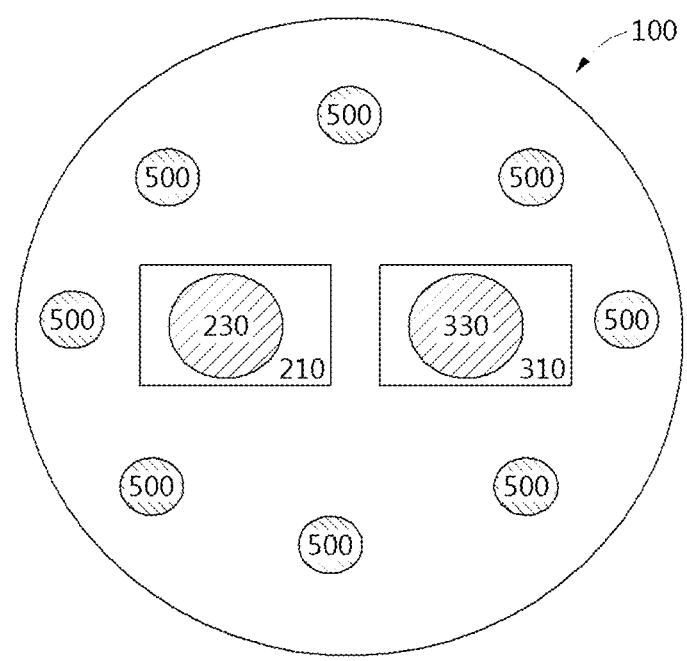

[FIG. 5]
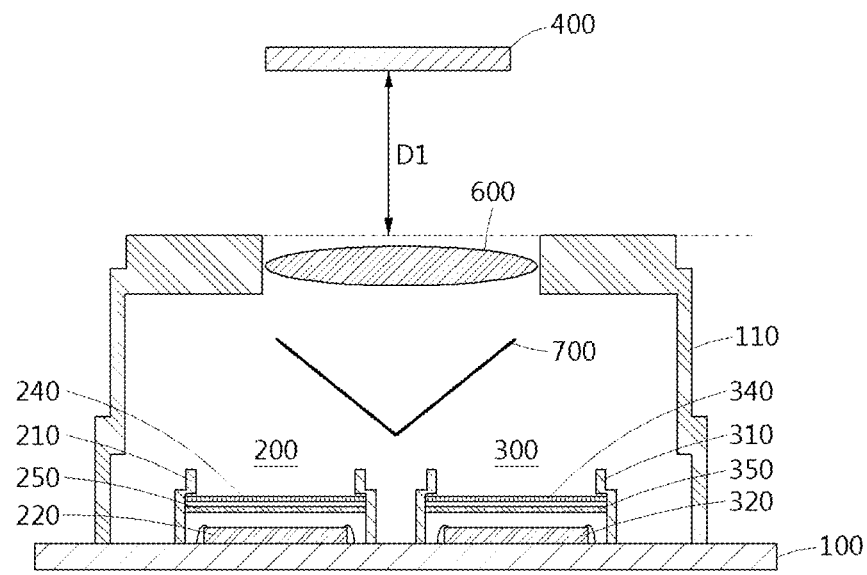
[FIG. 6]
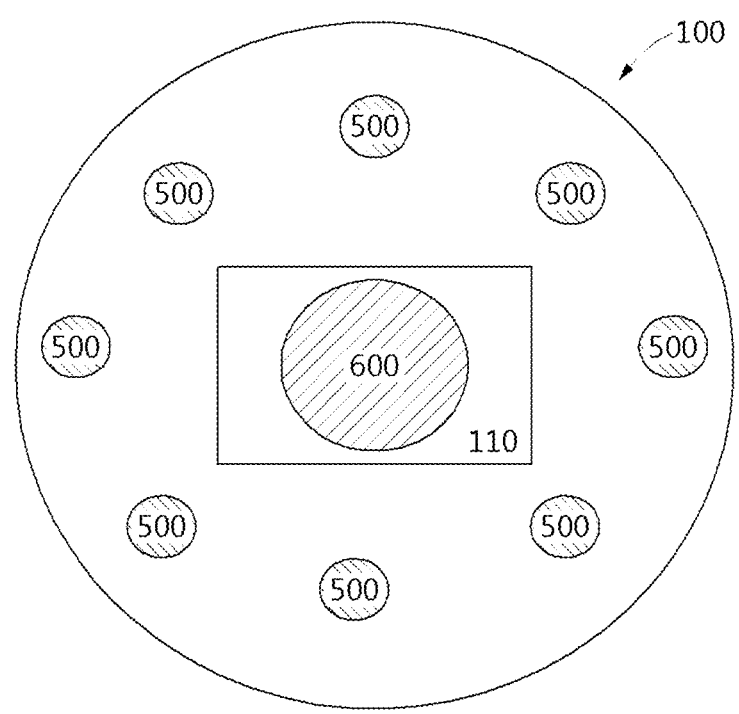

[FIG. 7A]
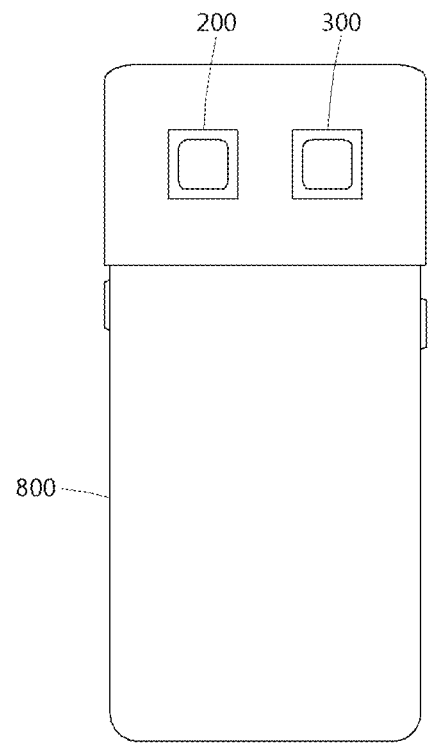
[FIG. 7B]
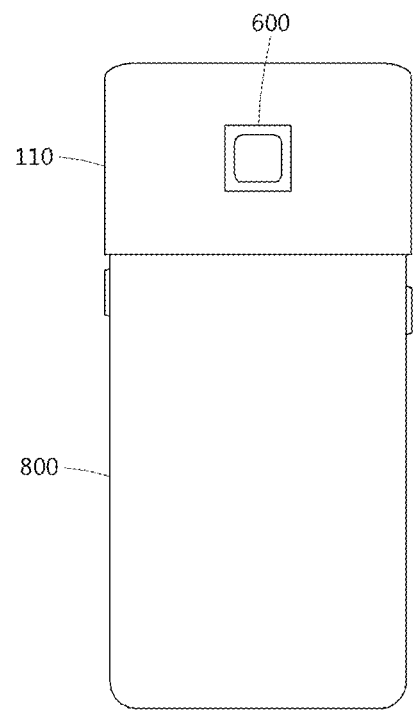

[FIG. 8]
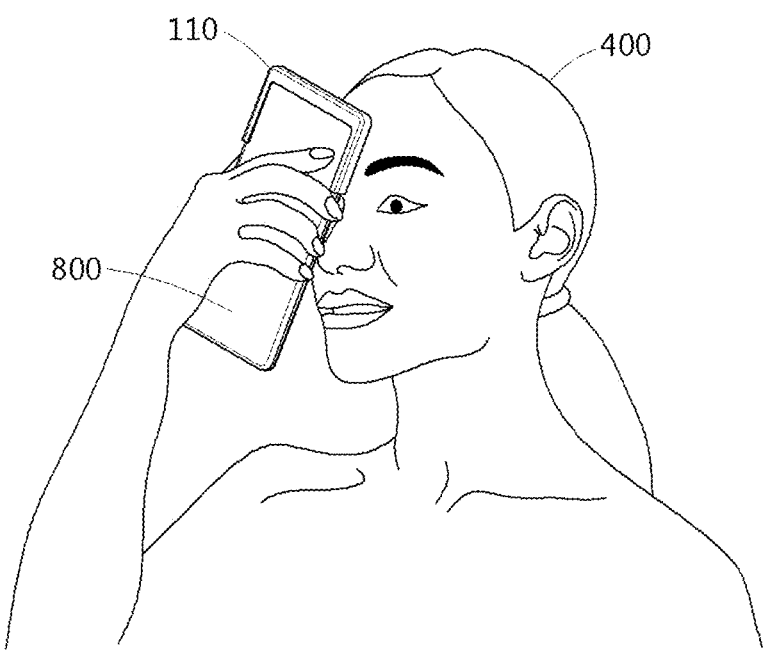
[FIG. 9]
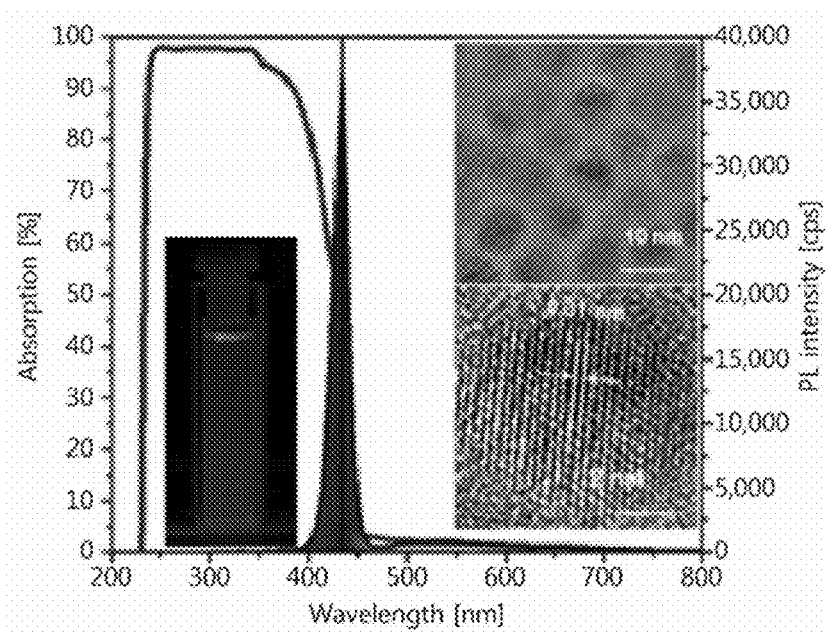

[FIG. 10]
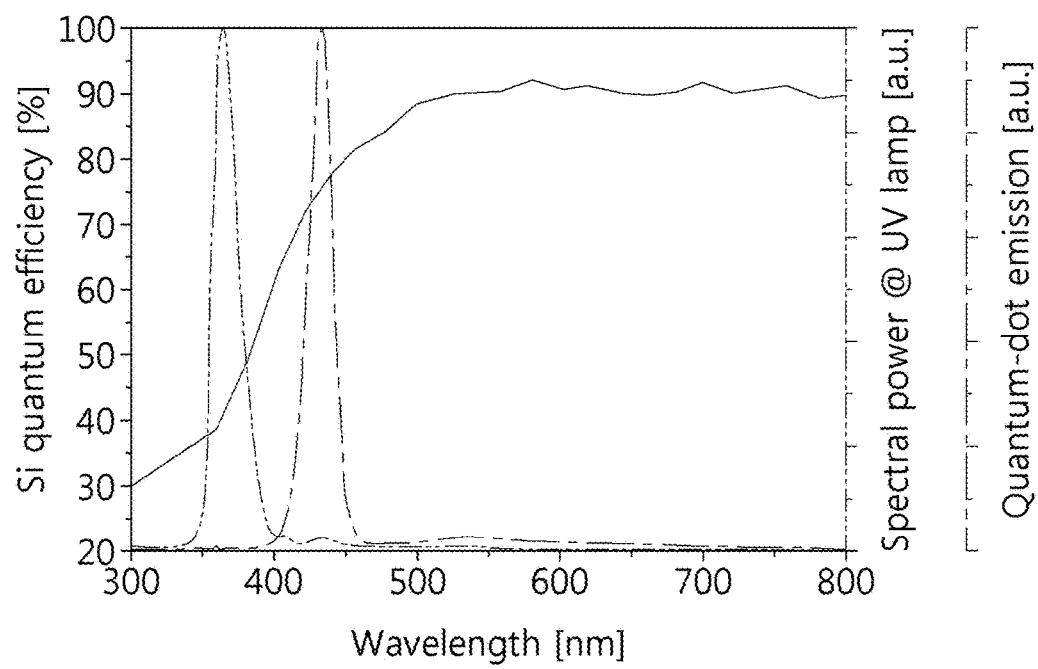
[FIG. 11]
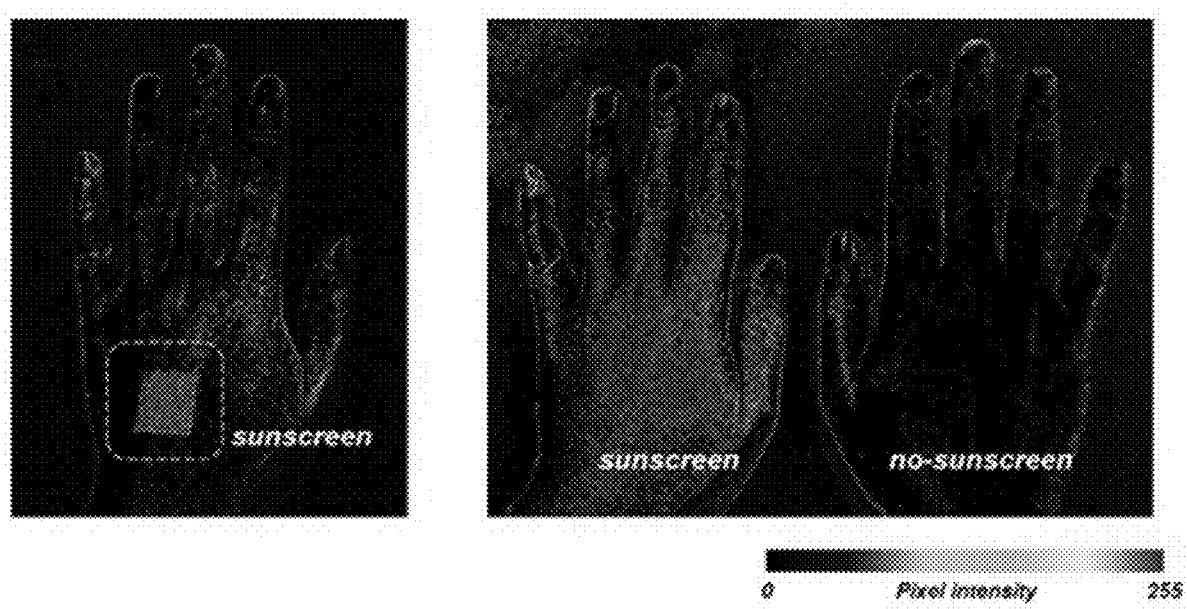

[FIG. 12]
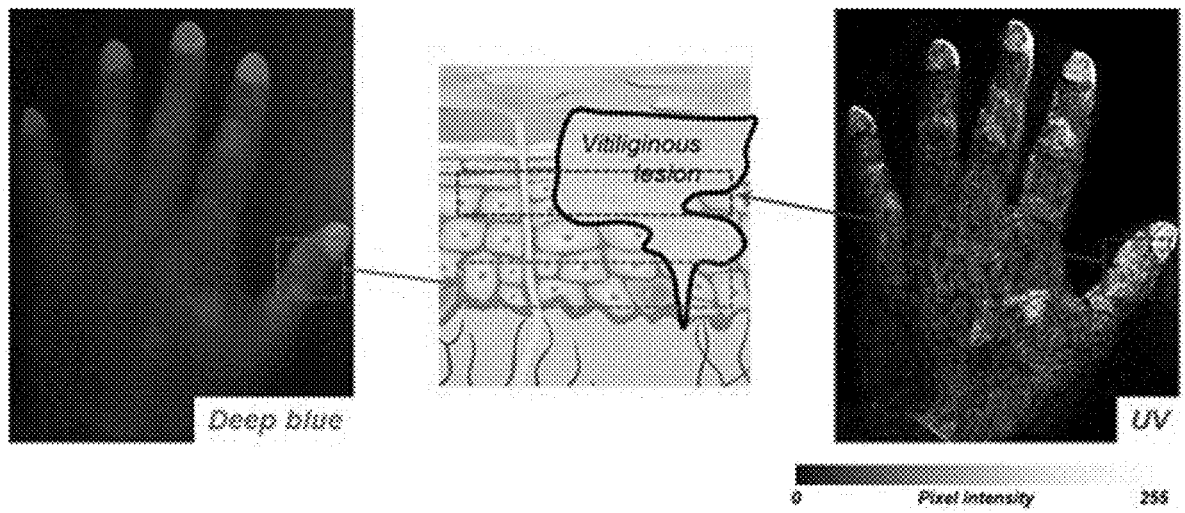
[FIG. 13]
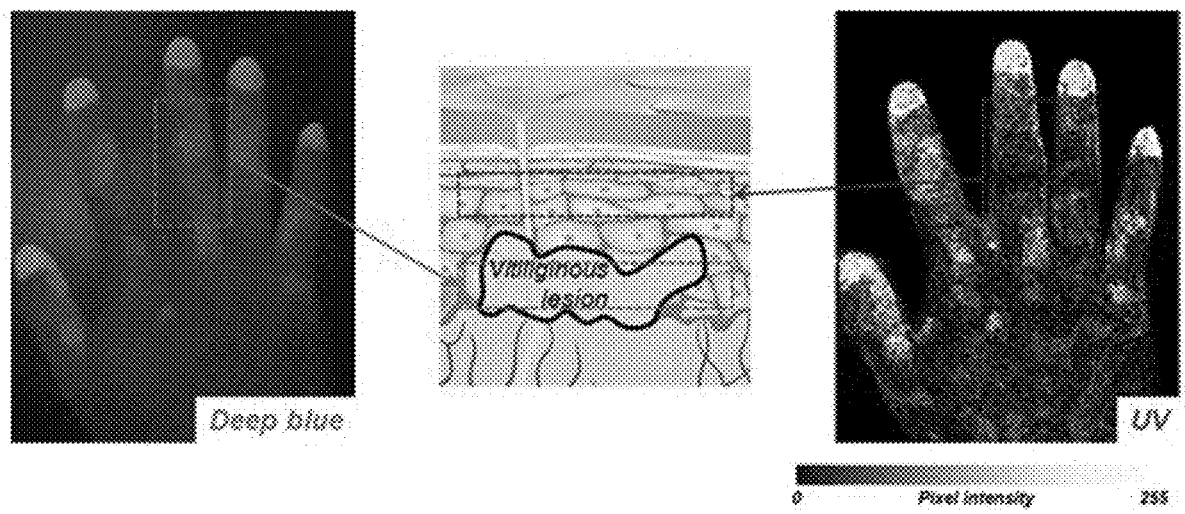

[FIG. 14]
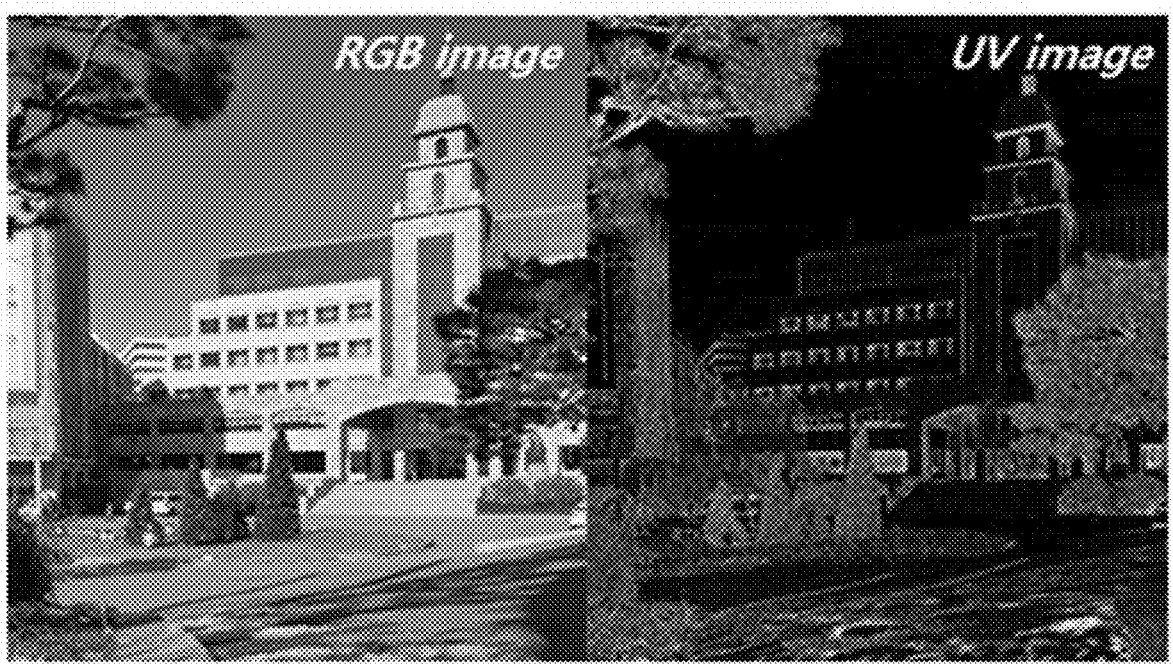
[FIG. 15]
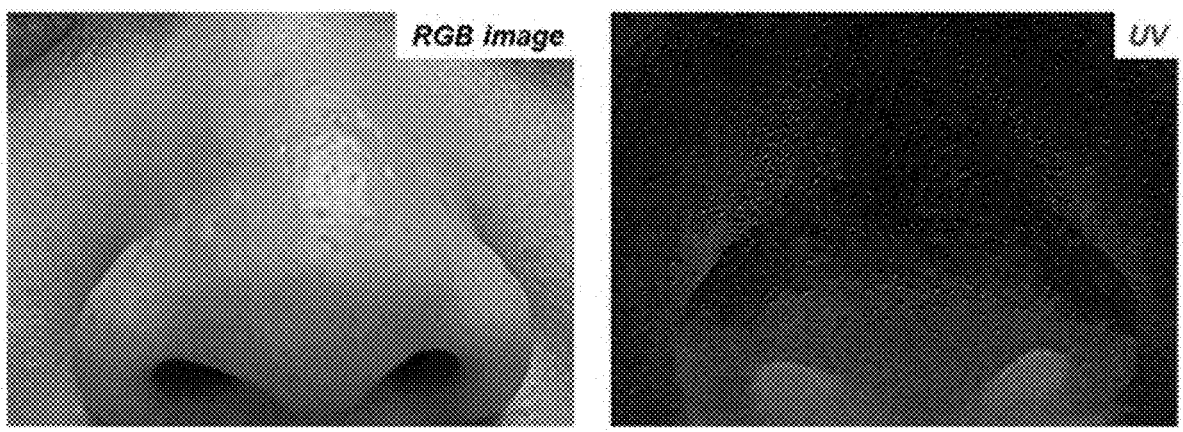

DUAL IMAGE SENSOR INCLUDING QUANTUM DOT LAYER

CROSS-REFERENCE TO RELATED APPLICATION

This application claims priority to Korean Patent Application No. 10-2018-0040188, filed on Apr. 6, 2018 in the Korean Intellectual Property Office, the disclosure of which is incorporated herein by reference.

TECHNICAL FIELD

The present invention relates to a dual image sensor including a quantum dot layer, and more particularly, to a dual image sensor including a quantum dot layer capable of displaying ultraviolet light.

BACKGROUND ART

In recent years, in accordance with development of the computer industry and the communication industry, demand for image sensors with improved performance in various fields, such as digital cameras, camcorders, personal communication systems (PCSs), game consoles, security cameras, and medical micro cameras, is increasing.

In general, image sensors are classified into charge-coupled device (CCD) and complementary metal-oxide-semiconductor (CMOS) image sensors. In the CCD image sensor, electrons generated by light are directly transferred to an output portion using gate pulses.

Therefore, even if voltage changes due to external noise during electron transfer, the number of electrons does not change, so that the output signal is not affected by noise. Because of these characteristics, CCD image sensors are widely used in multimedia devices requiring high image quality, such as digital cameras and camcorders.

In the case of CMOS image sensors, the driving method is easy, and signal processing circuits can be integrated on a single chip, thereby enabling miniaturization of the product.

Also, due to very low power consumption, CMOS image sensors are suitable for products with limited battery capacity. In addition, in manufacturing a CMOS image sensor, different types of CMOS image sensors can be manufactured using the same CMOS process technology, thereby reducing manufacturing costs. Therefore, with technological development, there is increasing demand for CMOS image sensors capable of realizing high-resolution images.

In addition, image sensors can respond to infrared or ultraviolet light that is invisible to the human eye. Therefore, when necessary, visible light should be blocked and only infrared or ultraviolet light should be transmitted. In this case, infrared or ultraviolet pixels are additionally used.

In Korean Patent Application Publication No. 10-2010-0079088, a technology for detecting visible light using a quantum dot lens instead of a microlenses and a color filter is disclosed. However, this technology has problems in that the process is complicated and infrared or ultraviolet light cannot be detected.

In Korean Patent Application Publication No. 10-2015-0118885, a technology relating to an organic photodiode (OPD) structure, in which organic materials, quantum dots, and group III-V materials are used as substances for detecting infrared light, is disclosed. In the organic photodiode (OPD) structure, light is adsorbed to form electron-hole pairs (EHPs), and then current is generated through upper and lower electrodes. However, this technology has problems in that photoelectric conversion efficiency is low and the process is complicated.

Ludong Li discloses a method of generating electron-hole pairs by zinc oxide quantum dots (ZnO QDs) absorbing ultraviolet light. In this method, a wide-band gap material (e.g., ZnO QDs) is used as a channel. This method also has a problem in that the process is complicated.

In U.S. Pat. No. 9,635,325, silicon nitride (SiNx) acts as a luminescent material for energy down-shift. In this technology, since visible light is excluded and only ultraviolet light is detected, there is a problem that it is difficult to form an image due to lack of optical light flux.

However, as described above, a photodiode (SOI, ZnO nano-pattern, $TiO_2$ nano-rod, graphene, or the like) having high sensitivity in a wavelength band of ultraviolet light was used as an image sensor to detect ultraviolet light.

However, a process of fabricating the photodiode is complicated. In addition, there is a limitation in that only the quantity of infrared or ultraviolet light can be measured using the photodiode.

In addition, in the case of a conventional image sensor capable of measuring ultraviolet light, a photodiode should be fabricated by applying a wide band gap material, such as an SOI structure, ZnO, $TiO_2$, graphene, or quantum dot, so as to realize high sensitivity (high photocurrent) in the ultraviolet wavelength band.

However, a process of fabricating a photodiode by applying a wide band gap material is complicated, and a conventional image sensor fabricated by applying the wide band gap material can measure only the quantity of ultraviolet light.

In addition, when a conventional Si CMOS image sensor is irradiated with ultraviolet light having a wavelength of <400 nm by means of an ultraviolet lamp (UV lamp) or an ultraviolet light emitting device (UV LED), there is a problem that a clear image cannot be obtained due to very low quantum efficiency of silicon at a wavelength of <400 nm.

DISCLOSURE

Technical Problem

Therefore, the present invention has been made in view of the above problems, and it is one object of the present invention to measure a depth profile of an object by absorbing light in different wavelength bands using a dual image sensor including a first image sensor module and a second image sensor module, which includes a quantum dot layer.

It is another object of the present invention to provide a dual image sensor capable of displaying (imaging) based on the quantity of ultraviolet light using a quantum dot layer.

It is another object of the present invention to provide a dual image sensor capable of detecting both visible light and ultraviolet light using a quantum dot layer that absorbs light within an ultraviolet wavelength band and emits visible light.

It is yet another object of the present invention to provide a dual image sensor capable of detecting ultraviolet light manufactured using a simple process of mounting a quantum dot layer on a conventional image sensor.

Technical Solution

In accordance with an aspect of the present invention, the above and other objects can be accomplished by the provision of a dual image sensor including first and second image sensor modules mounted on a printed circuit board, wherein the first image sensor module includes a first housing mounted on the printed circuit board; a first image sensor mounted on the printed circuit board and formed on a first surface of the first housing; and a first lens formed on a second surface of the first housing, and the second image sensor module includes a second housing mounted on the printed circuit board; a second image sensor mounted on the printed circuit board and formed on a first surface of the second housing; a second lens formed on a second surface of the second housing; and a quantum dot layer formed between the second image sensor and the second lens and absorbing ultraviolet light and emitting visible light converted from the absorbed ultraviolet light.

The dual image sensor may absorb first and second visible light, wherein the first visible light is absorbed by the first and second image sensor modules, and the second visible light is incident on the quantum dot layer and absorbed by the second image sensor module.

The quantum dot layer may convert the ultraviolet light into the second visible light via energy down-shift and emits the second visible light The dual image sensor may absorb light in different wavelength bands to measure a depth profile of an object.

The first and second image sensor modules may have different focal lengths from an object.

The quantum dot layer may be a blue quantum dot layer, wherein the blue quantum dot layer transmits the first visible light and selectively absorbs only the ultraviolet light to amplify the second visible light that is blue.

The quantum dot layer may be a red quantum dot layer, wherein the red quantum dot layer transmits the first visible light and selectively absorbs only the ultraviolet light to amplify the second visible light that is red.

The quantum dot layer may be a green quantum dot layer, wherein the green quantum dot layer transmits the first visible light and selectively absorbs only the ultraviolet light to amplify the second visible light that is green.

Transmittance of the quantum dot layer may be controlled depending upon a concentration of quantum dots.

The quantum dot layer may include quantum dots of at least one of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, GaSb, InP, InAs, InSb, AlP, AlS, AlSb, AlN, AlP, AlAs, InN, InP, InAs, PbS, PbSe, Si, Ge, MgS, MgSe, MgTe, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs which have a zinc blende structure, and combinations thereof.

The quantum dot layer may include at least one type of quantum dots having a core/single-shell structure, quantum dots having a core/multi-shell structure, and quantum dots having an alloy structure.

The printed circuit board may further include at least one light source mounted near the first and second image sensor modules.

The first image sensor module may further include a first infrared light (IR)-cut filter formed on the first image sensor.

The first image sensor module may further include a first blank filter formed on the first image sensor.

The second image sensor module may further include a second IR-cut filter formed on the quantum dot layer.

The first and second image sensors may include photoelectric conversion elements formed on a substrate to correspond to a plurality of pixel regions; a wiring layer formed on the substrate on which the photoelectric conversion elements are formed; and RGB color filters formed on the wiring layer to correspond to the photoelectric conversion elements.

The photoelectric conversion elements may be silicon-based photodiodes.

The first and second image sensors may further include microlenses formed on the RGB color filters.

In accordance with another aspect of the present invention, there is provided a dual image sensor including a lens holder mounted on a printed circuit board; first and second image sensor modules mounted on the printed circuit board and formed on a first surface of the lens holder; and a lens formed on a second surface of the lens holder, wherein the first image sensor module includes a first housing mounted on the printed circuit board; and a first image sensor mounted on the printed circuit board and formed on a first surface of the first housing, and the second image sensor module includes a second housing mounted on the printed circuit board; a second image sensor mounted on the printed circuit board and formed on a first surface of the second housing; and quantum dot layer formed on the second image sensor and absorbing ultraviolet light and emitting visible light converted from the ultraviolet light.

The dual image sensor may further include a mirror formed between the first and second image sensor modules and the lens.

Advantageous Effects

According to an embodiment of the present invention, a depth profile of an object can be measured by absorbing light in different wavelength bands using a dual image sensor including a first image sensor module and a second image sensor module, which includes a quantum dot layer.

According to an embodiment of the present invention, a dual image sensor capable of displaying (imaging) based on the quantity of ultraviolet light using a quantum dot layer can be manufactured.

According to an embodiment of the present invention, a dual image sensor capable of detecting both visible light and ultraviolet light using a quantum dot layer that absorbs light within an ultraviolet wavelength band and emits visible light can be manufactured.

According to an embodiment of the present invention, a dual image sensor capable of detecting ultraviolet light manufactured using a simple process of mounting a quantum dot layer on a conventional image sensor can be manufactured.

DESCRIPTION OF DRAWINGS

FIGS. 1A to 1C illustrate cross-sectional views of dual image sensors according to one embodiment of the present invention.

FIG. 2 illustrates a cross-sectional view of a first image sensor included in a dual image sensor according to one embodiment of the present invention.

FIG. 3 is a cross-sectional view illustrating a second image sensor and a quantum dot layer included in a dual image sensor according to one embodiment of the present invention.

FIG. 4 illustrates a plan view of a dual image sensor according to one embodiment of the present invention including at least one light source.

FIG. 5 illustrates a cross-sectional view of a dual image sensor according to another embodiment of the present invention.

FIG. 6 illustrates a plan view of a dual image sensor according to one embodiment of the present invention including at least one light source.

FIG. 7A illustrates a schematic view of a dual image sensor according to one embodiment of the present invention mounted as a module to a mobile device.

FIG. 7B illustrates a schematic view of a dual image sensor according to another embodiment of the present invention mounted as a module to a mobile device.

FIG. 8 is a schematic view illustrating an application example of a dual image sensor according to an embodiment of the present invention mounted as a module to a mobile device.

FIG. 9 is a graph illustrating the wavelength-dependent photoluminescence (PL) intensity and absorbance (Abs) of a quantum dot layer mounted in a dual image sensor according to an embodiment of the present invention.

FIG. 10 is a graph illustrating wavelength-dependent silicon quantum efficiency (Si quantum efficiency) and quantum dot emission intensity of a dual image sensor according to an embodiment of the present invention and spectral power (spectral power @ UV lamp) of an ultraviolet lamp.

FIG. 11 is an image illustrating a sunscreen test result using a UV camera equipped with a dual image sensor according to an embodiment of the present invention.

FIGS. 12 and 13 illustrate results of a depth profile of skin measured using a UV camera equipped with a dual image sensor according to an embodiment of the present invention.

FIG. 14 is an image of a building photographed with a UV camera equipped with a dual image sensor according to an embodiment of the present invention.

FIG. 15 illustrates sebum photographed with a UV camera equipped with a dual image sensor according to an embodiment of the present invention.

BEST MODE

The present invention will now be described more fully with reference to the accompanying drawings and contents disclosed in the drawings. However, the present invention should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context.

It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the invention and the appended claims, the singular forms "a", "an" and "the" are intended to include the plural forms as well, unless context clearly indicates otherwise.

Although terms used in the specification are selected from terms generally used in related technical fields, other terms may be used according to technical development and/or due to change, practices, priorities of technicians, etc.

Therefore, it should not be understood that terms used below limit the technical spirit of the present invention, and it should be understood that the terms are exemplified to describe embodiments of the present invention.

Also, some of the terms used herein may be arbitrarily chosen by the present applicant. In this case, these terms are defined in detail below. Accordingly, the specific terms used herein should be understood based on the unique meanings thereof and the whole context of the present invention.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein.

Meanwhile, in the following description of the present invention, a detailed description of known functions and configurations incorporated herein will be omitted when it may make the subject matter of the present invention unclear.

The terms used in the specification are defined in consideration of functions used in the present invention, and can be changed according to the intent or conventionally used methods of clients, operators, and users. Accordingly, definitions of the terms should be understood on the basis of the entire description of the present specification.

Hereinafter, a dual image sensor according to one embodiment of the present invention is described in detail with reference to FIGS. 1A to 1C.

FIGS. 1A to 1C illustrate cross-sectional views of dual image sensors according to one embodiment of the present invention.

FIGS. 1A to 1C include the same components except that the structures of printed circuit boards 100 are different. Accordingly, the same components are described only with reference to FIG. 1A.

A dual image sensor according to one embodiment of the present invention includes a printed circuit board 100, and a first image sensor module 200 and second image sensor module 300 mounted on the printed circuit board 100, the second image sensor module 300 including a quantum dot layer 340.

The dual image sensor according to one embodiment of the present invention may absorb first and second visible light. Here, the first visible light may be absorbed by the first and second image sensor modules 200 and 300, and the second visible light may be incident on the quantum dot layer 340 and may be absorbed by the second image sensor module 300.

Therefore, the first visible light may include visible light incident from the outside, and the second visible light may include visible light into which light in an ultraviolet wavelength band, which is incident from the outside, is converted by passing through the quantum dot layer 340.

Therefore, the dual image sensor according to one embodiment of the present invention may detect visible light, which is in a form of the first visible light, and ultraviolet light, which is incident on the quantum dot layer 340 and is converted into the second visible light, by a simple process of mounting the quantum dot layer 340.

In addition, a dual image sensor according to one embodiment of the present invention may display an image, depending upon the quantity of light in an ultraviolet wavelength band, through the second visible light emitted from the quantum dot layer 340.

A dual image sensor according to one embodiment of the present invention may measure a depth profile of the object 400 by absorbing light in different wavelength bands.

The object 400 is not particularly limited, but, for example, may be human skin.

For example, deep blue light may be used to measure a penetration depth of about 1 mm from the skin and ultraviolet light may be used to measure a penetration depth of about 0.5 mm from the skin because light deeply penetrates into human skin as the wavelength thereof light is long.

That is, since the dual image sensor according to one embodiment of the present invention measures an ultraviolet light image through the second image sensor module 300, surface-near information at a depth of 0.5 mm or less from the skin may be photographed and, accordingly, a depth profile may be measured.

More specifically, since the first image sensor module 200 of the dual image sensor according to one embodiment of the present invention does not include the quantum dot layer 340, a relatively deep portion of the object 400 may be detected using deep blue light.

In addition, since the second image sensor module 300 of the dual image sensor according to one embodiment of the present invention includes the quantum dot layer 340, a relatively shallow depth portion of the object 400 may be detected using ultraviolet light, whereby a depth profile of the object 400 may be measured.

Therefore, light in different wavelength bands may be absorbed and, accordingly, a depth profile of skin may be obtained by using the dual image sensor according to one embodiment of the present invention because the depth to which light penetrates human skin differs depending upon the wavelength of light.

In addition, both visible light and ultraviolet light may be detected because light in an ultraviolet wavelength band is absorbed and visible light therefrom is emitted using the quantum dot layer 340 in the dual image sensor according to one embodiment of the present invention.

In addition, the dual image sensor according to one embodiment of the present invention may detect ultraviolet light by adding a simple process of mounting the quantum dot layer 340 in a conventional image sensor.

The dual image sensor according to one embodiment of the present invention includes the printed circuit board 100.

According to an embodiment, one printed circuit board 100, on which both the first and second image sensor modules 200 and 300 are mounted, or a plurality of printed circuit boards 100, on which the first and second image sensor modules 200 and 300 are respectively mounted, may be provided.

The printed circuit board 100 may operate as a base plate supporting the first image sensor module 200 and the second image sensor module 300. However, a separate base plate may be provided under the printed circuit board 100 depending upon an embodiment.

In addition, the printed circuit board 100 may be formed under a first housing 210 of the first image sensor module 200 and a second housing 310 of the second image sensor module 300 to enclose the first and second image sensor modules 200 and 300.

A first image sensor 220 and a second image sensor 320 may be mounted on the printed circuit board 100, and the printed circuit board 100 may be electrically connected to the first and second image sensors 220 and 320.

The first image sensor module 200 includes the first housing 210 mounted on the printed circuit board 100, the first image sensor 220 mounted on the printed circuit board 100 and formed on a first surface of the first housing 210, and a first lens 230 formed on a second surface of the first housing 210.

A hollow may be formed in each of the first surface (lower surface) and the second surface (upper surface) of the first housing 210. The first image sensor 220 may be supported by the printed circuit board 100 and may be disposed in the hollow formed in the first surface of the first housing 210, and the first lens 230 may be received in the hollow formed in the second surface of the first housing 210.

The first lens 230 may include at least one lens. Light may pass through the first lens 230 and may be incident on the first image sensor 220.

The first lens 230 may have a predetermined radius of curvature. The radius of curvature may be changed depending upon the wavelength of light incident on the first image sensor 220.

The first lens 230 serves to focus light to increase the quantity of visible light or ultraviolet light absorbed by the first image sensor 220, thereby increasing the sensitivity of the image sensor.

In addition, the first housing 210 may be coupled with a case (not shown). The first housing 210 may be coupled with the case (not shown) by, for example, a fastener (not shown). Therefore, a through opening, into which a fastener is inserted, may be formed in a corner of the first housing 210.

The first housing 210 may have the shape of a block filled with silicon or epoxy.

In addition, a surface of the first housing 210 may be coated with a coating material. Accordingly, the coated surface of the first housing 210 may prevent light from entering thereinto.

Since the printed circuit board 100 blocks light when the first surface of the first housing 210 contacts the printed circuit board 100, a first surface (lower surface) of the first housing 210 might not be coated with a coating material.

The first image sensor 220 inside the first housing 210 may be mounted on the printed circuit board 100. In this case, the first image sensor 220 may be disposed on an upper surface of the printed circuit board 100.

The first image sensor 220 is described in more detail with reference to FIG. 2.

FIG. 2 illustrates a cross-sectional view of a first image sensor included in a dual image sensor according to one embodiment of the present invention.

The first image sensor 220 may include an active pixel sensor array. The active pixel sensor array may include a plurality of unit pixels arranged two-dimensionally in rows and columns.

An electrical signal may be generated by incident light in each of the unit pixels, and the unit pixels may include the photoelectric conversion elements 122 and logic elements, and the logic elements may include a transfer transistor (TX), a reset transistor (RX), a source follower transistor (SF), a current source transistor (CS), and a floating diffusion region (FD).

The first image sensor 220 may include the photoelectric conversion elements 222 formed to correspond to a plurality of pixel regions on a substrate 221, a wiring layer 223 formed on the substrate 221 including the photoelectric conversion elements 222, and RGB color filters 224R, 224G, and 224B formed to correspond to the photoelectric conversion elements 222.

The photoelectric conversion elements 222 formed to correspond to a plurality of pixel regions on a substrate 221 are included.

As the substrate 221, a substrate having n-type or p-type conductivity or an epitaxial substrate obtained by forming a p-type or n-type epitaxial layer on a bulk substrate may be used. An element separation layer (not shown) for separating an active region and a field region may be formed in the substrate 221, and the photoelectric conversion elements 120 and the logic elements may be formed in the active region of the substrate 221.

In addition, a deep well (not shown) may be formed in the substrate 221. The deep well may act as a potential barrier so that charges generated at the deep portion of the substrate 221 do not flow into the photoelectric conversion elements 120, and may act as a crosstalk barrier to reduce crosstalk between pixels due to random drift of charges by increasing recombination between charges and holes.

In the photoelectric conversion elements 222, incident light is absorbed and charges corresponding to the quantity of light are accumulated. As the photoelectric conversion elements 222, a photodiode, a phototransistor, a photogate, a pinned photodiode, or a combination thereof may be used. Preferably, a silicon-based photodiode may be used as the photoelectric conversion elements 222.

Preferably, the silicone-based photodiode may be an impurity region formed by doping the substrate 222 with impurities. The silicone-based photodiode may include N-type and P-type impurity regions. The N-type impurity region may be formed deep within the substrate 221, and the P-type impurity region may be thinly formed on the surface of the N-type impurity region.

The wiring layer 223 is formed on the substrate on which the photoelectric conversion elements 222 are formed.

Preferably, a plurality of insulating layers is formed on the upper part of the substrate 221 on which the photoelectric conversion elements 222 and the logic elements are formed, and each of the insulating layers may include the wiring layer 223 for electrical routing and/or shielding functions of the elements.

The insulating layers formed on the upper part of the photoelectric conversion elements 222 may be formed of an insulating material having a high transmittance to improve light transmittance, and may include a light transmitting part to improve the light transmittance of the upper part of the photoelectric conversion elements 222.

The wiring layer 223 may be connected to lower logic elements or other wiring through contacts (not shown), and may be formed in an area other than the area where the photoelectric conversion elements 222 are formed.

Therefore, the wiring layer 223 may be formed on the upper part of the logic elements of each unit pixel, and may block light from entering the region where the logic elements are formed.

The wiring layer 223 may include a plurality of metal wires, and may be formed of a metal material such as tungsten (W) or copper (Cu).

The image sensor of the present invention may include the color filters 224R, 224G, and 224B formed on the wiring layer 223 to correspond to the photoelectric conversion elements 222. The color filters 224R, 224G, and 224B may include a red color filter 224R, a green color filter 224G, and a blue color filter 224B.

The color filters 224R, 224G, and 224B may include the red color filter 224R, the green color filter 224G, and the blue color filter 224B, depending on the pixels.

Red light contained in the visible light may pass through the red color filter 224R, and photoelectrons corresponding to red light may be generated in the photoelectric conversion elements 222 of a red pixel.

Green light contained in the visible light may pass through the green color filter 224G, and photoelectrons corresponding to green light may be generated in the photoelectric conversion elements 222 of a green pixel.

Blue light contained in the visible light may pass through the blue color filter 224B, and photoelectrons corresponding to blue light may be generated in the photoelectric conversion elements 222 of a blue pixel.

In addition, according to an embodiment, the color filters may include white (W), magenta (Mg), yellow (Y), or cyan (Cy).

The first image sensor 220 may further include microlenses 225 formed on the RGB color filters 224R, 224G, and 224B, and the first image sensor 220 may be implemented as the microlenses 225.

Since ultraviolet light or visible light is focused by the microlenses 225 and then is absorbed by the photoelectric conversion elements 222, the quantity of the ultraviolet light or visible light absorbed by the photoelectric conversion elements 222 increases, thereby improving sensitivity of the first image sensor 220.

In addition, the microlenses 225 may be formed to correspond to the photoelectric conversion elements 222 and may have a predetermined radius of curvature.

Radii of curvature of the microlenses 225 may depend upon the wavelength of light incident on each pixel, and may change the path of light incident on an area outside the photoelectric conversion elements 222 to allow light to be focused on the photoelectric conversion elements 222.

Referring to FIG. 1A again, the first image sensor module 200 of the dual image sensor according to one embodiment of the present invention may further include a first infrared light (IR)-cut filter 250 formed on the first image sensor 220.

The first IR-cut filter 250 is used to block infrared light acting as noise in general photography. For example, the first IR-cut filter 250 may have a transmittance of 10% or less in a wavelength area of 760 nm or more.

The first IR-cut filter 250 is made of a glass material for absorbing and filtering infrared light. Preferably, the first IR-cut filter 250 may be made of a glass plate, a film, or a sheet.

The first IR-cut filter 250 may have a thickness of 0.3 mm or less, preferably less than 0.25 mm or less than 0.21 mm. Although thinner glass (having a higher content of IR absorbing ions, preferably Cu ions) may be used as the first lit-cut filter 250, the first IR-cut filter 250 may have a thickness within the range for mechanical stabilization.

According to an embodiment, the first IR-cut filter 250 may be an inorganic or organic coating including a base and a colorant in the base. The colorant may be dissolved in the base and may be composed of small particles (pigment).

The pigment may have preferably a particle size of less than 1 more preferably a main particle diameter of 8 to 1,000 nm, even more preferably a main particle diameter of 10 to 500 nm, to prevent scattering.

The colorant may include at least one of an azo dye, a polymethine dye, a cyanine dye, a triphenylmethane dye, a carbonyl dye such as anthraquinone, indigo, porphyrin, and phthalocyanine, preferably porphyrin and phthalocyanine.

The colorant may be embedded or dissolved in an inorganic or organic base. As the inorganic base, a sol-gel base is preferred.

The organic base may include at least one of a polyurethane resin, a hybrid polymer, silicon (by organic and/or inorganic cross-linking), a phenolic resin, an epoxide, a polyamide, a polyimide, ethylene vinyl acetate (EVA), a polyester resin, and a mixture and polymer thereof.

Preferably, the base may be a sol-gel base or a polyurethane base.

The organic or inorganic coating may be applied by at least one of spin coating, spray coating, dip coating, casting, screen printing, doctoring, inkjet printing, pad printing, rolling coating, and spread coating. Preferably, the organic or inorganic coating may be applied by spin coating.

In addition, the first image sensor module 200 of the dual image sensor according to one embodiment of the present invention may further include a blank filter 240 formed on the first image sensor 220. Preferably, the blank filter 240 may be formed on an upper part of the first IR-cut filter 250.

The second image sensor module 300 includes the quantum dot layer 340. Here, the quantum dot layer 340 may be formed by coating a film or sheet made of glass or quartz or a transparent film or sheet with quantum dots 241. A transmittance reduction of <10% may occur in the transparent film.

Therefore, the blank filter 240 may be inserted into the first image sensor module 200 so as to satisfy the same conditions as the second image sensor module 300.

The blank filter 240 may be formed of at least one of glass, quartz and a transparent film on which the quantum dot layer 340 is not formed and may be a transparent film or sheet.

The second image sensor module 300 includes the second housing 310 mounted on the printed circuit board 100, the second image sensor 320 mounted on the printed circuit board 100 and formed on a first surface of the second housing 310, the second lens 330 formed on a second surface of the second housing 310, and the quantum dot layer 340 formed between the second image sensor 320 and the second lens 330 and absorbing ultraviolet light and emitting visible light converted from the absorbed ultraviolet light.

Components of the printed circuit board 100, the second housing 310, the second image sensor 320, and the second lens 330 of the second image sensor module 300 are the same as those of the printed circuit board 100, the first housing 210, the first image sensor 220, and the first lens 230 of the first image sensor module 200. Accordingly, description of the same components is omitted.

The second image sensor module 300 includes the quantum dot layer 340 that is formed between the second image sensor 320 and the second lens 330 and absorbs ultraviolet light and emits visible light converted from the absorbed ultraviolet light.

The second image sensor 320 and the quantum dot layer 340 of the second image sensor module 300 are described in more detail with reference to FIG. 3.

FIG. 3 is a cross-sectional view illustrating a second image sensor and a quantum dot layer included in a dual image sensor according to one embodiment of the present invention.

The second image sensor 320 included in the second image sensor module 300 may include photoelectric conversion elements 322 formed to correspond to a plurality of pixel regions on a substrate 321, a wiring layer 323 formed on the substrate 321 including the photoelectric conversion elements 322, and RGB color filters 324R, 324G, and 324B formed on the wiring layer 323 to correspond to the photoelectric conversion elements 322.

In addition, the second image sensor module 300 includes the quantum dot layer 340 that is formed on the second image sensor 320 and absorbs ultraviolet light and emits visible light converted from the absorbed ultraviolet light.

Light absorbed by the quantum dot layer 340 may be light in an ultraviolet wavelength band.

A silicon-based photodiode is used as the photoelectric conversion elements 322. The depth at which light incident from the outside enters the silicon-based photodiode varies depending on the wavelength range of the incident light.

In the case of light in the ultraviolet wavelength band having high energy (E≥3.1 eV) and a short wavelength (λ≤400 nm), a silicon-based photodiode absorbs only when the light is present near a surface. Accordingly, free charge is decreased due to surface recombination, whereby the charge current efficiency associated with change in the amount of incident photons and the sensitivity of the image sensor may be greatly decreased.

However, in the dual image sensor according to one embodiment of the present invention, the second image sensor module 300 includes the quantum dot layer 340 responsible for converting incident light in an ultraviolet wavelength band into visible light (second visible light).

Therefore, the visible light (second visible light) to which a silicon-based photodiode is highly sensitive is incident on the silicon-based photodiode. Thus, the quantum dot layer 340 allows the dual image sensor of the present invention to detect light in an ultraviolet wavelength band, thereby improving the ultraviolet light sensitivity of the dual image sensor.

In addition, the quantum dot layer 340 may convert light in an ultraviolet wavelength band into second visible light P2 via energy down-shift and emit the second visible light P2.

More specifically, quantum dots included in the quantum dot layer 340 may absorb light in an ultraviolet wavelength band having a wavelength range of about 400 nm or less. The absorbed light in an ultraviolet wavelength band may be converted into the second visible light P2 having a wavelength of about 380 nm to 800 nm by the quantum dots, and the second visible light P2 may be emitted from the quantum dot layer 340.

Therefore, the quantum dot layer 340 is capable of converting incident light into light having a long wavelength via energy down-shift.

The quantum dot layer 340 of the dual image sensor according to one embodiment of the present invention may be formed of any one of a red quantum dot layer including red quantum dots, a green quantum dot layer including green quantum dots, and a blue quantum dot layer including blue quantum dots.

When the quantum dot layer 340 is a blue quantum dot layer, the blue quantum dot layer may allow transmission of blue, green, and red light within the visible light wavelength band and selectively absorb light in an ultraviolet wavelength band to amplify blue visible light.

More specifically, when visible light is incident on the second image sensor module 300 including a blue quantum dot layer, the red color filter 324R, the green color filter 324G, and the blue color filter 324B may transmit the visible light, and first visible light P1 may be incident on the photoelectric conversion elements 322.

When light in an ultraviolet wavelength band is incident on the second image sensor module 300 including a blue quantum dot layer, the blue quantum dot layer may absorb the light in an ultraviolet wavelength band and emit blue visible light (the second visible light P2), the red color filter 324R and the green color filter 324G might not transmit the blue visible light, and only the blue color filter 324B may transmit the blue visible light.

Therefore, only the first visible light P1 may be incident on the photoelectric conversion elements 322 corresponding to the red color filter 324R and the green color filter 324G, and the first and second visible light P1 and P2 may be incident on the photoelectric conversion element 322 corresponding to the blue color filter 324B. As a result, the quantity of absorbed light may be increased, resulting in a difference in light intensity or light quantity (flux)

When the quantum dot layer 340 is a red quantum dot layer, the red quantum dot layer may transmit blue, green, and red light within the visible light wavelength band and selectively absorb light in an ultraviolet wavelength band to amplify red visible light.

More specifically, when visible light is incident on the second image sensor module 300 including a red quantum dot layer, the red color filter 324R, the green color filter 324G, and the blue color filter 324B may transmit the visible light, and the first visible light P1 may be incident on the photoelectric conversion elements 322.

When light in an ultraviolet wavelength band is incident on the second image sensor module 300 including a red quantum dot layer, the red quantum dot layer may absorb the light in an ultraviolet wavelength band and emit red visible light (the second visible light P2). The blue color filter 324B and the green color filter 324G might not transmit the red visible light, and only the red color filter 324R may transmit the red visible light.

Therefore, only the first visible light P1 may be incident on the photoelectric conversion elements 322 corresponding to the blue color filter 324B and the green color filter 324G, and the first and second visible light P1 and P2 may be incident on the photoelectric conversion element 322 corresponding to the red color filter 324R. As a result, the quantity of absorbed light may be increased, resulting in a difference in light intensity or light quantity (flux).

When the quantum dot layer 340 is a green quantum dot layer, the green quantum dot layer may transmit blue, green, and red light within the visible light wavelength band and selectively absorb light in an ultraviolet wavelength band to amplify green visible light.

More specifically, when visible light is incident on the second image sensor module 300 including a green quantum dot layer, the red color filter 324R, the green color filter 324G, and the blue color filter 324B may transmit the visible light, and the first visible light P1 may be incident on the photoelectric conversion elements 322.

When light in an ultraviolet wavelength band is incident on the second image sensor module 300 including a green quantum dot layer, the green quantum dot layer may absorb the light in an ultraviolet wavelength band and emit green visible light (the second visible light P2), the blue color filter 324B and the red color filter 324R might not transmit the green visible light, and only the green color filter 324G may transmit the green visible light.

Therefore, only the first visible light P1 may be incident on the photoelectric conversion elements 322 corresponding to the blue color filter 324B and the red color filter 324R, and the first and second visible light P1 and P2 may be incident on the photoelectric conversion element 322 corresponding to the green color filter 324G. As a result, the quantity of absorbed light may be increased, resulting in a difference in light intensity or light quantity (flux).

In FIG. 3, a blue quantum dot layer is used as the quantum dot layer 340. However, the present invention is not limited thereto, and a red quantum dot layer or a green quantum dot layer may also be used.

In addition, the transmittance of the quantum dot layer 340 may be controlled by adjusting the concentration of quantum dots.

When the concentration of quantum dots in the quantum dot layer 340 is increased, transmittance in the visible light wavelength band may be reduced due to light scattering generated in the quantum dot layer 340.

Therefore, when the concentration of quantum dots included in the quantum dot layer 340 is increased, the light intensity or light quantity (flux) of the first visible light P1 is decreased, so that the influence of the second visible light P2 increases. As a result, the pixel intensity difference in the photoelectric conversion elements 322 may be clearly confirmed.

More specifically, in the case of the first visible light P1 incident on the second image sensor 320 of the second image sensor module 300 including the quantum dot layer 340, the transmittance of light in a visible light wavelength band may be decreased by the quantum dot layer 340.

However, in the case of the second visible light P2, light in an ultraviolet wavelength band may be converted into light in the visible light wavelength band by the quantum dot layer 340 and the converted visible light may be emitted from the quantum dot layer 340, thereby increasing light intensity or light quantity (flux).

Therefore, since the intensity or quantity (flux) of light in a visible light wavelength band incident on the dual image sensor according to one embodiment of the present invention is decreased and the intensity or quantity (flux) of light in an ultraviolet wavelength band incident thereon increases, pixel intensity may be clarified.

The quantum dot layer 340 may include quantum dots 341 formed on a transparent substrate and a transparent substrate.

The transparent substrate may be made of at least one of glass, quartz, and a polymer. For example, polyethylene terephthalate (PET) may be used as the polymer. Preferably, the transparent substrate may be made of quartz having a transmittance of about 90% at all wavelengths. In addition, the transparent substrate may be provided in the form of a film or a sheet.

The quantum dots 341 may be formed on the transparent substrate by deposition or coating.

The quantum dot layer 340 may include a plurality of quantum dots. The quantum dots may include red, green, or blue quantum dots.

The quantum dots 341 may include at least one of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, GaSb, InP, InAs, InSb, AlP, AlS, AlSb, AlN, AlP, AlAs, InN, InP, InAs, PbS, PbSe, Si, Ge, MgS, MgSe, MgTe, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, and InAlNAs, InAlPAs, which have a zinc blende structure, and combinations thereof.

The zinc blende structure is a crystal structure found in compound MX, wherein M is a positive element and X is a negative element and, for example, the structure of ZnS belongs thereto. In particular, in an equiaxed crystal system of space group F43m, X forms a face-centered cubic lattice and M is present in a tetrahedral four-coordinate position In addition, the quantum dots 341 may include at least one type of quantum dots having a core/single-shell structure, quantum dots having a core/multi-shell structure, and quantum dots having an alloy structure.

External quantum efficiency of the quantum dots having a core/single-shell structure or the quantum dots having a core/multi-shell structure may be increased by adjusting the diameter of the quantum dot core and the thickness of the quantum dot shell.

According to an embodiment, a second IR-cut filter 350 may be further provided on the quantum dot layer 340 of the second image sensor module 300 of the dual image sensor according to one embodiment of the present invention.

The second IR-cut filter 350 is used to block infrared light acting as noise in general photographing. For example, the second IR-cut filter 350 may have a transmittance of 10% or less in a wavelength area of 760 nm or more.

The second IR-cut filter 350 is made of a glass material for absorbing and filtering infrared light. Preferably, the second IR-cut filter 350 may be made of a glass plate, a film, or a sheet.

The second IR-cut filter 350 may have a thickness of 0.3 mm or less, preferably less than 0.25 mm or less than 0.21 mm. Although thinner glass (having a higher content of IR absorbing ions, preferably Cu ions) may be used as the second IR-cut filter 350, the second IR-cut filter 350 may have a thickness within the range for mechanical stabilization of the second IR-cut filter 350.

According to an embodiment, the second IR-cut filter 350 may be an inorganic or organic coating including a base and a colorant in the base. The colorant may be dissolved in the base and may be composed of small particles (pigment).

The pigment may have preferably a particle size of less than 1 μm, more preferably a main particle diameter of 8 to 1,000 nm, even more preferably a main particle diameter of 10 to 500 nm, to prevent scattering.

The colorant may include at least one of an azo dye, a polymethine dye, a cyanine dye, a triphenylmethane dye, a carbonyl dye such as anthraquinone, indigo, porphyrin, and phthalocyanine, preferably porphyrin and phthalocyanine.

The colorant may be embedded or dissolved in an inorganic or organic base. As the inorganic base, a sol-gel base is preferred.

The organic base may include at least one of a polyurethane resin, a hybrid polymer, silicon (by organic and/or inorganic cross-linking), a phenolic resin, an epoxide, a polyamide, a polyimide, ethylene vinyl acetate (EVA), a polyester resin, and a mixture and polymer thereof. Preferably, the base may be a sol-gel base or a polyurethane base.

The organic or inorganic coating may be applied by at least one of spin coating, spray coating, dip coating, casting, screen printing, doctoring, inkjet printing, pad printing, rolling coating, and spread coating. Preferably, the organic or inorganic coating may be applied by spin coating.

Referring to FIG. 1A again, when the dual image sensor according to one embodiment of the present invention is manufactured into a dual camera module including the first image sensor module 200 excluding the quantum dot layer 340 and the second image sensor module 300 including the quantum dot layer 340, two images respectively photographed by the first and second image sensor modules 200 and 300 may be subjected to image processing to only extract an image generated by light in an ultraviolet wavelength band.

Currently, a dual camera mounted in smart phones is generally equipped with a wide-angle lens and telephoto lens, respectively, to generate a clear image and increase a viewing angle.

However, since the dual image sensor according to one embodiment of the present invention includes the quantum dot layer 340, a clear image may be generated and a viewing angle may be increased even using the same lens and image sensor.

In addition, an image is generated by R-light, G-light, and B-light in a conventional dual image sensor excluding the quantum dot layer 340, whereas an image may be generated by B-light generated by ultraviolet light, other than existing R-light, G-light, and B-light, due to the quantum dot layer 340 included in the dual image sensor according to one embodiment of the present invention.

The dual image sensor according to one embodiment of the present invention may be installed, as a module, in a mobile device such as a smart phone, or may be separately manufactured to be capable of operating alone.

More specifically, the dual image sensor according to one embodiment of the present invention may be mounted in a mobile device, may be manufactured as a separate module to be detachably installed in a mobile device, or may be manufactured to independently serve as a camera.

However, a mounting form of the dual image sensor according to one embodiment of the present invention is not limited to the aforementioned forms, and the dual image sensor according to one embodiment of the present invention may be easily applied to, without being limited to conventional devices or fields including an image sensor, any fields wherein an image sensor is used.

Therefore, the dual image sensor according to one embodiment of the present invention includes the first image sensor module 200 and the second image sensor module 300 including the quantum dot layer 340, thereby measuring both light in a visible light wavelength band of sunlight and light in an ultraviolet wavelength band thereof.

According to an embodiment, the dual image sensor according to one embodiment of the present invention may be mounted in a mobile device or may be separately manufactured. In addition, the dual image sensor according to one embodiment of the present invention may be equipped with an additional light source to emit ultraviolet light.

The light source may include at least one of an ultraviolet lamp (UV lamp) and an ultraviolet light emitting device (UV LED).

According to an embodiment, the first and second image sensor modules 200 and 300 of the dual image sensor according to one embodiment of the present invention may have different focal lengths from the object 400.

The first and second image sensor modules 200 and 300 of the dual image sensor according to one embodiment of the present invention illustrated in FIG. 1A have the same focal length D1 from an object 400.

Hereinafter, dual image sensors according to embodiments of the present invention having different focal lengths from an object 400 are described in detail with reference to FIGS. 1B and 1C.

FIGS. 1B and 1C illustrate cross-sectional views of the dual image sensors according to embodiments of the present invention having different focal lengths from an object.

A dual image sensor according to one embodiment of the present invention may be manufactured to have a structure, wherein focal lengths D1 and D2 from an object 400 are different, using a bent printed circuit board 100 as shown in FIG. 1B.

Alternatively, a dual image sensor according to one embodiment of the present invention may be manufactured to have a structure, wherein focal lengths D1 and D2 from an object 400 are different, using a printed circuit board 100 having a step as shown in FIG. 1C.

A dual image sensor according to one embodiment of the present invention may be manufactured to have the focal lengths D1 and D2 different from the object 400 by modifying the structure of the printed circuit board 100 according to the user convenience.

Focal lengths D1 and D2 between the first and second lenses 230 and 230 and the object 400 are measured to measure a degree to which the first and second lenses 230 and 330 converge or diverge light. The depth of field may increase as the focal lengths D1 and D2 decrease, and the depth of field may be decreased as the focal lengths D1 and D2 increase.

In addition, a diaphragm value is decreased as the focal lengths D1 and D2 between the first and second lenses 230 and 330 and the object 400 decrease, whereby the quantity of incident light increases and thus a bright image may be obtained. On the other hand, a diaphragm value increases as the focal lengths D1 and D2 increase, whereby the quantity of incident light is decreased and thus a dark image may be obtained.

Therefore, a clearer and higher quality image may be obtained by differently adjusting the focal lengths D1 and D2 between the first and second image sensor modules 200 and 300 and the object 400 of the dual image sensor according to one embodiment of the present invention.

FIG. 4 illustrates a plan view of a dual image sensor according to one embodiment of the present invention including at least one light source.

A printed circuit board 100 of a dual image sensor according to one embodiment of the present invention may further include at least one light source 500 mounted near a first image sensor module 200 and a second image sensor module 300.

Therefore, the light source 500 may be disposed near a first housing 210 and a second housing 310. However, disposition of the light source 500 is not limited thereto and the light source 500 may also be disposed in the first housing 210 and the second housing 310 in which a first image sensor and a second image sensor are received.

The light source 500 may include at least one of an ultraviolet lamp (UV lamp) and an ultraviolet light emitting device (UV LED).

At least one light source 500 may be formed on the printed circuit board 100 and may be installed at regular intervals.

Preferably, eight light sources 500 may be mounted on the first and second image sensor modules 200 and 300, but the number and positions of the eight light sources 500 are not limited thereto. The number and positions of the eight light sources 500 may be changed depending upon an environment or an object.

When the dual image sensor according to one embodiment of the present invention includes the light source 500, an object may be more accurately measured and thus a measurement error may be prevented.

FIG. 5 illustrates a cross-sectional view of a dual image sensor according to another embodiment of the present invention.

The dual image sensor according to another embodiment of the present invention includes the same components as those of the dual image sensor according to one embodiment of the present invention. Accordingly, description of the same components is omitted.

The dual image sensor according to another embodiment of the present invention includes a lens holder 110 mounted on a printed circuit board 100, a first image sensor module 200 and a second image sensor module 300 mounted on the printed circuit board 100 and formed on a first surface of the lens holder 110, and a lens 600 formed on a second surface of the lens holder 110.

The first image sensor module 200 includes a first housing 210 mounted on the printed circuit board 100 and a first image sensor 220 mounted on the printed circuit board 100 and formed on a first surface of the first housing 210.

The second image sensor module 300 includes a second housing 310 mounted on the printed circuit board 100, a second image sensor 320 mounted on the printed circuit board 100 and formed on a first surface of the second housing 310, and a quantum dot layer 340 formed on the second image sensor 320 and absorbing ultraviolet light and emitting visible light converted from the absorbed ultraviolet light.

One printed circuit board 100 on which both the first image sensor module 200 and the second image sensor module 300 are mounted may be provided. According to an embodiment, a plurality of printed circuit boards 100 on which the first image sensor module 200 and the second image sensor module 300 are respectively mounted may be provided.

The printed circuit board 100 may operate as a base plate supporting the first image sensor module 200 and the second image sensor module 300. However, a separate base plate may be provided under the printed circuit board 100 depending upon an embodiment.

In addition, the printed circuit board 100 may be located under the first image sensor module 200 and the second image sensor module 300 to enclose lower parts of the lens holder 110, the first housing 210, and the second housing 310.

A first image sensor 220 and a second image sensor 320 may be mounted on the printed circuit board 100, and the printed circuit board 100 may be electrically connected to the first and second image sensors 220 and 320.

A hollow may be formed in each of the first surface (lower surface) and the second surface (upper surface) of the lens holder 110. The first and second image sensor modules 220 and 300 may be supported by the printed circuit board 100 and may be disposed in the hollow formed on the first surface, and the lens 600 may be received in the hollow formed on the second surface.

The lens 600 may include at least one lens.

The lens 600 may have a predetermined radius of curvature. The radius of curvature may be changed depending upon the wavelength of light incident on each pixel. The lens 600 serves to focus light to increase the quantity of visible light or ultraviolet light absorbed by the first and second image sensors 220 and 320, thereby increasing the sensitivity of the image sensor.

In addition, the lens holder 110 may be coupled with a case (not shown). The lens holder 110 may be coupled with the case (not shown) by, for example, a fastener (not shown). Therefore, a through opening, into which a fastener is inserted, may be formed in a corner of the lens holder 110.

The lens holder 110 may have the shape of block filled with silicon or epoxy In addition, a surface of the lens holder 110 may be coated with a coating material. Accordingly, the coated surface of the lens holder 110 may prevent light from entering thereinto.

Since the printed circuit board 100 blocks light when the first surface of the lens holder 110 contacts the printed circuit board 100, a first surface (lower surface) of the lens holder 110 might not be coated with a coating material.

The components of the first and second image sensor modules 200 and 300 mounted inside the lens holder 110 on the printed circuit board 100 are the same as those of the first and second image sensor modules 200 and 300 included in the dual image sensor according to one embodiment of the present invention, except that a lens is not present on the second surfaces of the first and second housings 210 and 310 of the first and second image sensor modules 200 and 300 mounted inside the lens holder 110.

According to an embodiment, the dual image sensor according to another embodiment of the present invention may include a mirror 700.

The mirror 700 may be an L-shaped mirror. The mirror 700 is provided on the upper part of the first and second image sensor modules 200 and 300 and converts the path of light incident thereon to be incident on the first and second image sensor modules 200 and 300. Therefore, the mirror 700 may be disposed at a position corresponding to the lens 600 and a pointed portion of the mirror 700 may point downward (or upward).

The width of the mirror 700 may be approximately equal to or slightly larger than the width of the hollow on the second surface of the lens holder 110 or the width of the lens 600.

In addition, the dual image sensor according to another embodiment of the present invention includes the first image sensor module 200 and the second image sensor module 300 including the quantum dot layer 340, thereby measuring both light in a visible light wavelength band of sunlight and light in an ultraviolet wavelength band thereof.

FIG. 6 illustrates a plan view of a dual image sensor according to one embodiment of the present invention including at least one light source.

A printed circuit board of the dual image sensor according to another embodiment of the present invention may further include at least one light source 500 mounted near a first image sensor module and a second image sensor module.

More specifically, the light source 500 may be arranged near the lens holder 110 receiving the first and second image sensor modules of the dual image sensor according to another embodiment of the present invention, but the position of the light source 500 is not limited thereto. The light source 500 may be disposed in the lens holder 110 receiving the first and second image sensor modules.

The light source 500 may include at least one of an ultraviolet lamp (UV lamp) and an ultraviolet light emitting device (UV LED).

At least one light source 500 may be formed on the printed circuit board and may be installed at regular intervals.

Preferably, eight light sources 500 may be mounted on the first and second image sensor modules, but the number and positions of the eight light sources 500 are not limited thereto. The number and positions of the eight light sources 500 may be changed depending upon an environment or an object.

When the dual image sensor according to another embodiment of the present invention includes the light source 500, an object may be more accurately measured and thus a measurement error may be prevented.

FIG. 7A illustrates a schematic view of a dual image sensor according to one embodiment of the present invention mounted as a module to a mobile device.

The dual image sensor according to one embodiment of the present invention may be manufactured into a dual camera and thus may be mounted in the mobile device 800.

Therefore, since the dual image sensor according to one embodiment of the present invention includes the first image sensor module 200 and the second image sensor module 300 including the quantum dot layer, thereby measuring both light in a visible light wavelength band of sunlight and light in an ultraviolet wavelength band thereof.

According to an embodiment, when the dual image sensor according to an embodiment of the present invention is manufactured into a dual camera and thus is mounted in the mobile device 800, an object may be easily measured by disposing at least one light source inside or outside the first image sensor module 200 and/or the second image sensor module 300.

FIG. 7B illustrates a schematic view of a dual image sensor according to another embodiment of the present invention mounted as a module to a mobile device.

The dual image sensor according to another embodiment of the present invention may be manufactured into a dual camera and thus may be mounted in the mobile device 800.

Therefore, since the dual image sensor according to another embodiment of the present invention includes the first image sensor module 200 and the second image sensor module 300 including the quantum dot layer, thereby measuring both light in a visible light wavelength band of sunlight and light in an ultraviolet wavelength band thereof.

According to an embodiment, when the dual image sensor according to another embodiment of the present invention is manufactured into a dual camera and thus is mounted in the mobile device 800, an object may be easily measured by disposing at least one light source near the lens 600.

FIG. 8 is a schematic view illustrating an application example of a dual image sensor according to an embodiment of the present invention mounted as a module to a mobile device.

The dual image sensor according to an embodiment of the present invention may be manufactured into a dual camera and thus may be mounted in the mobile device 800, thereby monitoring an object 400.

For example, the dual image sensor according to an embodiment of the present invention may be manufactured into a dual camera and thus may be easily coupled to and separated from the mobile device 800. Accordingly, the state of human skin and a depth profile of skin may be easily diagnosed.

FIG. 9 is a graph illustrating the wavelength-dependent photoluminescence (PL) intensity and absorbance (Abs) of a quantum dot layer mounted in a dual image sensor according to an embodiment of the present invention.

Referring to FIG. 9, it can be confirmed that the quantum dot layer absorbs ultraviolet light and emits blue visible light converted from the absorbed ultraviolet light, and a transmittance tends to slightly decrease in a visible light band.

FIG. 10 is a graph illustrating wavelength-dependent silicon quantum efficiency (Si quantum efficiency) and quantum dot emission intensity of a dual image sensor according to an embodiment of the present invention and spectral power (spectral power @ UV lamp) of an ultraviolet lamp.

Referring to FIG. 10, it can be confirmed that the quantum efficiency of silicon increases because ultraviolet light is converted into blue light due to the quantum dot layer of the dual image sensor according to an embodiment of the present invention. Therefore, the dual image sensor according to an embodiment of the present invention increases the photosensitivity of a silicon CMOS image sensor (Si CIS) to obtain a clear image.

FIG. 11 is an image illustrating a sunscreen test result using a UV camera equipped with a dual image sensor according to an embodiment of the present invention.

A left image of FIG. 11 shows an image photographed with a UV camera equipped with the dual image sensor according to an embodiment of the present invention in sunlight after applying sunscreen only to a part of a hand. As a result, the reflectance of ultraviolet light is high only in the part, to which ultraviolet light has been applied, because sunscreen reflects ultraviolet light, so that the flux of light introduced into the UV camera increases and thus pixel intensity is high.

In addition, a right image of FIG. 11 shows an image photographed with a UV camera equipped with the dual image sensor according to an embodiment of the present invention after applying sunscreen to the entire left hand without application of sunscreen to a right hand. As a result, it can be confirmed that the reflectance of ultraviolet light is entirely high and thus pixel intensity is high in the left hand to which sunscreen has been applied, whereas ultraviolet light is absorbed by the skin of the right hand to which sunscreen has not been applied left and thus pixel intensity is low.

FIGS. 12 and 13 illustrate results of a depth profile of skin measured using a UV camera equipped with a dual image sensor according to an embodiment of the present invention.

Referring to FIG. 12, it can be confirmed that lesions on the skin are not measured under deep blue (see the left image), but a pixel intensity is measured to be high under ultraviolet light, which indicates that lesions caused by vitiligo are present on a surface of the skin (see the right image).

In addition, referring to FIG. 12, it can be expected that the germs, which are not observed in the deep blue channel, but are observed in the ultraviolet light (UV) channel, are located at a depth of 0 to 0.5 mm from the skin.

Referring to FIG. 13, a pixel intensity is measured to be high and thus is brightly displayed under deep blue, whereas the pixel intensity is measured to be low under ultraviolet light, which indicates that lesions caused by vitiligo are present in relatively deep parts of the skin, i.e., parts deeper than a depth where ultraviolet light penetrates.

In addition, referring to FIG. 13, it can be expected that germs observed in a deep blue channel, but not observed in a UV channel (UV channel) are located at a depth of 0.5 mm to 1 mm from the skin.

Therefore, referring to FIGS. 12 and 13, it can be confirmed that the first image sensor module, which does not include the quantum dot layer, in the dual image sensor according to an embodiment of the present invention measures deep parts of the skin using deep blue light, and the second image sensor module including the quantum dot layer therein measures a surface of the skin using ultraviolet light and thus is capable of photographing a skin part of a vitiligo patient at which melanocytes are destroyed.

That is, a depth profile of skin may be created using the dual image sensor according to an embodiment of the present invention to be used for medical diagnosis.

FIG. 14 is an image of a building photographed with a UV camera equipped with a dual image sensor according to an embodiment of the present invention.

Referring to FIG. 14, it can be confirmed that the dual image sensor according to an embodiment of the present invention may image both visible light and ultraviolet light.

FIG. 15 illustrates sebum photographed with a UV camera equipped with a dual image sensor according to an embodiment of the present invention.

Referring to FIG. 15, sebum is not observed when a general image sensor excluding a quantum dot layer is used (see the left image), but sebum is not observed when the dual image sensor including the quantum dot layer according to an embodiment of the present invention is used (see the right image). That is, since the dual image sensor according to an embodiment of the present invention includes the quantum dot layer, sebum may be measured by ultraviolet light.

Meanwhile, embodiments of the present invention disclosed in the present specification and drawings are only provided to help understanding of the present invention and the present invention is not limited to the embodiments. It will be apparent to those skilled in the art that various modifications can be made to the above-described exemplary embodiments of the present invention without departing from the spirit or scope of the invention.

The invention claimed is:

1. A dual image sensor, comprising:
   first and second image sensor modules mounted on a printed circuit board,
   wherein the first image sensor module comprises a first housing mounted on the printed circuit board; a first image sensor mounted on the printed circuit board and formed on a first surface of the first housing; and a first lens formed on a second surface of the first housing,
   wherein the second image sensor module comprises a second housing mounted on the printed circuit board; a second image sensor mounted on the printed circuit board and formed on a first surface of the second housing; a second lens formed on a second surface of the second housing; and a quantum dot layer formed between the second image sensor and the second lens and absorbing ultraviolet light and emitting visible light converted from the absorbed ultraviolet light, and
   wherein the first image sensor absorbs only first visible light, and the second image sensor absorbs the first visible light and second visible light that is converted from the ultraviolet light by the quantum dot layer.

2. The dual image sensor according to claim 1, wherein the quantum dot layer converts the ultraviolet light into the second visible light via energy down-shift and emits the second visible light.

3. The dual image sensor according to claim 1, wherein the dual image sensor absorbs light in different wavelength bands to measure a depth profile of an object.

4. The dual image sensor according to claim 1, wherein the first and second image sensor modules have different focal lengths from an object.

5. The dual image sensor according to claim 1, wherein the quantum dot layer is a blue quantum dot layer,
wherein the blue quantum dot layer transmits the first visible light and selectively absorbs only the ultraviolet light to amplify the second visible light that is blue.

6. The dual image sensor according to claim 1, wherein the quantum dot layer is a red quantum dot layer,
wherein the red quantum dot layer transmits the first visible light and selectively absorbs only the ultraviolet light to amplify the second visible light that is red.

7. The dual image sensor according to claim 1, wherein the quantum dot layer is a green quantum dot layer,
wherein the green quantum dot layer transmits the first visible light and selectively absorbs only the ultraviolet light to amplify the second visible light that is green.

8. The dual image sensor according to claim 1, wherein transmittance of the quantum dot layer is controlled depending upon a concentration of quantum dots.

9. The dual image sensor according to claim 1, wherein the quantum dot layer comprises quantum dots of at least one of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, GaSb, InP, InAs, InSb, AlP, AlS, AlSb, AN, AlP, AlAs, InN, InP, InAs, PbS, PbSe, Si, Ge, MgS, MgSe, MgTe, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs which have a zinc blende structure, and combinations thereof.

10. The dual image sensor according to claim 1, wherein the quantum dot layer comprises at least one type of quantum dots having a core/single-shell structure, quantum dots having a core/multi-shell structure, and quantum dots having an alloy structure.

11. The dual image sensor according to claim 1, wherein the printed circuit board further comprises at least one light source mounted near the first and second image sensor modules.

12. The dual image sensor according to claim 1, wherein the first image sensor module further comprises a first infrared light (IR)-cut filter formed on the first image sensor.

13. The dual image sensor according to claim 1, wherein the first image sensor module further comprises a first blank filter formed on the first image sensor.

14. The dual image sensor according to claim 1, wherein the second image sensor module further comprises a second IR-cut filter formed on the quantum dot layer.

15. The dual image sensor according to claim 1, wherein the first and second image sensors comprise photoelectric conversion elements formed on a substrate to correspond to a plurality of pixel regions;
a wiring layer formed on the substrate on which the photoelectric conversion elements are formed; and
RGB color filters formed on the wiring layer to correspond to the photoelectric conversion elements.

16. The dual image sensor according to claim 15, wherein the photoelectric conversion elements are silicon-based photodiodes.

17. The dual image sensor according to claim 15, wherein the first and second image sensors further comprise microlenses formed on the RGB color filters.

18. A dual image sensor, comprising:
a lens holder mounted on a printed circuit board;
first and second image sensor modules mounted on the printed circuit board and formed on a first surface of the lens holder; and
a lens formed on a second surface of the lens holder,
wherein the first image sensor module comprises a first housing mounted on the printed circuit board; and a first image sensor mounted on the printed circuit board and formed on a first surface of the first housing,
wherein the second image sensor module comprises a second housing mounted on the printed circuit board; a second image sensor mounted on the printed circuit board and formed on a first surface of the second housing; and quantum dot layer formed on the second image sensor and absorbing ultraviolet light and emitting visible light converted from the ultraviolet light, and
wherein the first image sensor absorbs only first visible light, and the second image sensor absorbs the first visible light and second visible light that is converted from the ultraviolet light by the quantum dot layer.

19. The dual image sensor according to claim 18, further comprising a mirror formed between the first and second image sensor modules and the lens.

* * * * *